United States Patent
Reinecke et al.

(10) Patent No.: US 6,251,567 B1
(45) Date of Patent: Jun. 26, 2001

(54) PROCESS FOR MANUFACTURING MICROSTRUCTURED BODIES

(75) Inventors: Holger Reinecke; Norbert Kapitza; Ralph-Ulrich Ballhorn, all of Dortmund; Ulrike Spitzner, Herne; Bernhard Schaefermeier, Bonn, all of (DE)

(73) Assignee: Microparts Gesellschaft, Dortmund (DE)

( * ) Notice: Subject to any disclaimer, the term of this patent is extended or adjusted under 35 U.S.C. 154(b) by 0 days.

(21) Appl. No.: 09/157,518

(22) Filed: Sep. 21, 1998

(30) Foreign Application Priority Data

Sep. 19, 1997 (DE) .............................. 197 41 492

(51) Int. Cl.[7] ...................................... G03F 7/20
(52) U.S. Cl. .......................... 430/325; 430/967; 378/34; 250/492.2
(58) Field of Search .................... 430/311, 322, 430/325, 967, 280.1; 250/492.2; 378/34.35

(56) References Cited

U.S. PATENT DOCUMENTS

| 4,756,989 | 7/1988 | Ai et al. ............................... 430/272 |
| 5,153,898 | 10/1992 | Suzuki et al. .......................... 378/34 |
| 5,415,977 | 5/1995 | Wuensch et al. ..................... 430/326 |

FOREIGN PATENT DOCUMENTS

| 0 375 929 | 7/1990 | (EP) . |
| 0 547 419 | 6/1993 | (EP) . |
| 0 851 295 | 7/1998 | (EP) . |

OTHER PUBLICATIONS

Y. Zhang, et al., Appl. Phys. Lett., vol. 67, No. 6, pp. 872–874, "High Aspect Ratio Micromachining Teflon by Direct Exposure to Synchrotron Radiation", Aug. 7, 1995.

H. Lorenz, et al., Microelectronic Engineering, vol. 41/42, pp. 371–374, "Mechanical Characterization of a New High–Aspect–Ration Near UV–Photoresist", 1998.

H. Lorenz, et al., Sensors and Actuators A, vol. 64, No. 1, pp. 33–39, "High–Aspect–Ratio, Ultrathick, Negative–Tone Near–UV Photoresist and its Application for Mems", 1998.

*Primary Examiner*—Kathleen Duda
(74) *Attorney, Agent, or Firm*—Oblon, Spivak, McClelland, Maier & Neustadt, P.C.

(57) ABSTRACT

A method for manufacturing a microstructured body, comprises irradiating a material with a pattern of X-rays; and dissolving selectively irradiated or non-irradiated regions of the material, where the material comprises a light-hardening and/or UV-hardening epoxy coating. The epoxy coatings need shorter irrdiation times than known plastics. The resulting microstructures can have high aspect ratios, and the developed structures can be produced with greater structure depths, free of defects and faults. Structural precision is in the submicron range.

14 Claims, No Drawings

PROCESS FOR MANUFACTURING MICROSTRUCTURED BODIES

BACKGROUND OF THE INVENTION

1. Field of the Invention

The invention relates to a process for manufacturing microstructured bodies with structural depths ranging from several microns to several millimeters, with lateral dimensions in the micron range, by irradiation of polymers with X-rays and subsequent development with suitable developing media

2. Description of the Background

In microelectronics, the technological advances of increasing miniaturization and integration have led to a myriad new products. Compared to other sectors, the advances in miniaturization in microelectronics in just a few recent years have been remarkable. Indications are that in the future other microtechniques as well will become important. Areas which might be mentioned are micromechanics, integrated optics, and microfluidics. Such technologies, in combination with microelectronics, offer the possibility of numerous novel electronic, optical, biological, and mechanical functional elements of revolutionary types. The highly productive manufacturing methods of semiconductor technology can be exploited in a wide range of applications in the mass production of miniaturized non-electronic components, modules, and subsystems. Classical methods of fine fabrication for micromechanics have been strengthened and combined with appropriately modified methods from semiconductor fabrication, to go beyond the constraints of planar silicon technology and make available novel options in the forning of materials, applicable for numerous shapes and configurations, and numerous materials. An advance of this nature is the LIGA method (Lithographie-Galvanoformung-Abformung (i.e., lithography-galvanoforming-molding)), which combines fabrication steps involving lithography, galvanoforming (electrochemical forming), and molding, and is described in German Patent Application No. 41 42 001, incorporated herein by reference. The method was developed at Kernforschungszentrum Karlsruhe (the Karlsruhe, Germany Nuclear Research Center). The essential fabrication step of the original LIGA method is the structurally accurate irradiation of a polymer material. The basic practicability of the LIGA method can be demonstrated by microstructures produced in a specially manufactured polymethyl methacrylate (PMMA). A number of other plastics have been developed with the aim of compatibility with forming techniques employing X-ray irradiation. Among these one might mention polyoxymethylene (POM), and polyesters, particularly polyglycolides and polylactides, as described in German Patent Application No. 41 41 352 A1.

The use of "SU8" epoxy photoresist for microstructuring using UV lithography has been described in a number of publications: Despont, M., Lorenz, H., Fahrin, N., Brügger, J., Renaud, P., and Vettiger, P., 1997, "High-aspect-ratio, ultrathick, negative-tone near-UV photoresist for micro electro mechanical systems (MEMS) applications", in "Proc. of the 10th IREE International Workshop on Micro Electro Mechanical Systems (MEMS '97)", Jan. 26–30, 1997, Nagoya, Japan; and Lee, La Bianca, et al., "Micromachining applications of a high resolution ultrathick photoresist", J.Vac.Sci.Technol., B13(6), November/December 1995, all of which are hereby incorporated by reference. In addition, epoxide mixtures are used for the encapsulation of, e.g., microelectronic, electronic, or optical components (see PROTAVIC brochure).

In the fabrication of complex three-dimensional structures with structural depths ranging from several microns to several millimeters, using the LIGA method, it has been found that the existing plastics require a substantial amount of irradiation. It has also been found that in the development of irradiated polymer articles with a suitable developing medium the un-irradiated polymer regions tend to swell, wherewith the fine structures formed may be distorted or otherwise faulty. Further, the swollen polymer regions can result in stress cracking when the material is dried, thereby rendering the microstructure bodies unsuitable for electrochemical processing. Another problem is that for some of the plastics used, the processing is complex and expensive. This is true of polylactides and polyglycolides, wherewith costly stamping steps must be employed to apply the materials to substrates prior to irradiation.

UV-hardening coating systems may be used for fabricating microstructures. With these it has been impossible with the means at hand to achieve the level of submicron precision and accuracy which is often needed for optical and fluidic components; the difficulties are attributed to diffraction, scattering, and interference effects on the irradiating light (wavelengths 300 mn to 460 mn), if the coating thicknesses are in the micron and millimeter range.

SUMMARY OF ThE INVENTION

An object of the invention is to provide a polymer which requires relatively little radiation when irradiated with synchrotron radiation.

Another object of the invention is to provide a polymer which undergoes depolymerization or crosslinidng under the influence of X-ray irradiation.

Another object of the invention is to provide a polymer which is selectably removable with the use of special developers.

In addition, the polymer should be easy to fabricate into test bodies, should not experience stress cracking, and should not contain faults. Preferably, it should be maximally compatible with semiconductor fabrication processes.

The objects are provided by a method of manufacturing microstructure bodies with structural depths ranging from several microns to several millimeters by pattemwise irradiation of polymers with X-rays, wherein the polymers employed comprise UV-hardening and/or light-hardening epoxy resin coatings. The X-rays used preferably are supplied by synchrotron radiation. In carrying out the inventive method, the epoxy coatings may be applied to a support by means of pressing, extruding, stamping, embossing, injection molding, or spin-coating. The method can be carried out in a plurality of stages.

Surprisingly, it was discovered that light-hardening epoxy coatings known from the technologies of semiconductor fabrication and plastic adhesives can be microstructured using X-rays, and such coatings satisfy the above-indicated criteria It was surprising that X-ray hardenable epoxide coatings could be used for producing microstructure bodies wherein a high aspect ratio is an important factor, as is required, e.g., for the LIGA method. Further, the advantages achieved with said coatings were surprising and were not suggested by known publications.

DETAILED DESCRIPTION OF THE INVENTION

According to the inventive method, microstructure bodies with structural depths ranging from one micron to 10 millimeters can be fabricated, such that with synchrotron radiation and the action of selective developers with a removal depth of 1 micron to 1000 micron, bodies or features can be structured which have lateral dimensions in the micron to submicron range. Suitable selective developers are organic solvents and alkaline media, preferably, e.g., propylene glycol monomethyl ether acetate (PGMEA), hydroxide solutions with glycol components, or alcoholic alkali hydroxide solutions.

The irradiation in the inventive method is carried out by high energy parallel radiation from X-ray sources. The wavelengths of these sources are in the range 0.1 nm to 10 nm, preferably 0.1–1 nm. Such irradiation may comprise, e.g. irradiation 1 to 300 minutes with an average ring current of e.g. 25 mA, in a synchrotron, with special pre-absorbers, e.g. comprised of beryllium or polyimide film (e.g. "Kapton", supplied by the firm DuPont de Nemours).

The amount of irradiation depends on the electron energy in the electron storage ring branched off from the synchrotron. In general, the electron energy is in the range 1.0–2.7 GeV.

For patternwise irradiation, typically one uses special X-ray masks, e.g. comprised of a support foil of titanium, beryllium, or diamond, bearing absorber structures comprised of gold or tungsten.

Particularly suitable for the inventive method are:
 "SU8" epoxy coating (supplied commercially by the firm Micro Resist Technology), or
 the liquid photoresists supplied by the firm Lackwerke Peters GmbH for the manufacture of printed circuits by means of etching techniques, which photoresists have become well known under the trade name ELPEMER.

Examples of other materials which may be used are the protective coatings supplied commercially by the firm Protex under the trade names PROTAVIC PU and PROTAVIC UV.

The epoxy coatings used in the production of the microstructure bodies may be applied to solid supports, preferably electrically conducting metal supports such as nickel, copper, steel, or titanium, by means of pressing, injection molding, extruding, or spin-coating, at temperatures in the range 20–100° C. In this connection, adhesive layers, adhesive coatings, or special adhesion promoters may be employed. The thickness of the epoxide coatings on the supports is generally in the range 1–10,000 micron, preferably 10–1000 micron, particularly preferably 100–800 micron.

Following the patternwise irradiation, development is carried out using suitable developing media. Developer systems which may be used may be based on alkylene glycol alkylether alkylmonocarboxylic acid ester compounds of the general formula

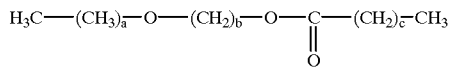

where a=0 to 5, b=2 to 4, and c=0 to 5, or isomers of these; e.g., propylene glycol monomethylether acetate, propylene glycol monoethylether acetate, ethylene glycol butylether acetate, butylene glycol isopropylether propanoate; or basic developers, such as: alkali hydroxide solutions combined with glycols, or alcoholic alkali hydroxide solutions.

The inventive method has the following advantages:
 The polymer used is suitable for microstructuring. The polymer enables the production of microstructures with structure widths as small as a few microns, and having high aspect ratios (ratio of height to width of the structure) in the range 5:1 to 1000:1 (preferably in the range 10:1 to 100:1).
 The described epoxy coatings allow microstructures to be produced which have substantially greater structure depths, for a given irradiation cost, than do the plastic materials known in the art. The sensitivity of said coatings is greater than that of PMMA by a factor of 100 to 1000.
 The method enables fabrication of structures with structure heights of, e.g., 500 micron and lateral dimensions in the submicron range, without defects.
 Structural precision in the submicron range can be achieved.
 The microstructures have sharp, steep edges, and smooth walls.
 The polymer is mechanically stable up to 80° C., and has adequate thermomechanical strength.
 The polymer can withstand galvanic processes without problems, and is resistant to the action of, e.g., copper and nickel acid baths, sulfiric acid, sulfamic acid, and complex-forming agents. At temperatures in the range 20–80° C., the microstructures are unaffected after 24 hr in galvanic baths.
 The surface of the plastic is smooth. The plastic can be applied to the support in uniform coating thicknesses.
 The described developers have very good selectivity.
 The described epoxy coatings are very well suited for the LIGA process, and are very amenable to processing in equipment used in semiconductor technology.

Having generally described this invention, a further understanding can be obtained by reference to certain specific examples which are provided herein for purposes of illustration only and are not intended to be limiting unless otherwise specified.

EXAMPLE 1

A coating of "SU8" epoxy coating material of thickness 505±5 micron was applied to a support comprised of a silicon wafer, having dimensions 100 mm diameter×0.5 mm thick. This resist was dried on a hot plate at 90° C., after which it was subjected 35 minutes to patternwise synchrotron irradiation with electron energy 2.3 GeV and average ring current 20 mA; the scanner stroke was 20 mm and the scanner speed 1 mm/sec. The X-ray mask used was configured for test structures comprising fields comprised of hexagonal prisms of diameters 1–500 micron. Developing was carried out with PGMEA at 25° C., 25 min. The structure was developed in completely free form. The typical structures produced in the structured epoxy coating were completely free of residues from the developing, and displayed excellent developability down to a diameter of 5 micron (side to side cross dimension of the hexagon).

COMPARITIVE EXAMPLE 1

A test body comprised of PMMA was irradiated 60 min under conditions corresponding to those of Example 1, and was developed with GG-developer, which is the optimum developer for PMMA. The depth of material removed was only 100 micron. Using the same prismatic test structure, the smallest-diameter prism which could be effectively produced was 50 micron in diameter; prisms with smaller diameters had distortion or other serious defects.

As seen from the comparison of Example 1 and Comparitive Example 1, a structure height of c. 500 micron in PMMA requires irradiation for at least 10 hr under the same conditions; aspect ratios up to 40 are achievable. In contrast, "SU8" can yield deeper structures with shorter irradiation times and higher aspect ratios, at a lower cost, and with higher quality.

EXAMPLE 2

A coating of "ELPEMER SD 2054" epoxy coating material of a thickness of 300 microns was applied by spin-coating, to a support comprised of copper, and was subjected for 15 minutes to patternwise irradiation in a synchrotron with 2.3 GeV electron energy and average ring current 20 mA. The scanner stroke was 20 mm. The X-ray mask used had a spectrometer configuration. The subsequent developing was carried out using a 5% solution of sodium hydroxide in 1:1 water/ethylene glycol at 25° C. for 75 min. The structure was developed in completely free form. The structured epoxy displayed outstanding definition of the functional tooth edges of the typical grid teeth of the spectrometer structure. The spectrometer was free of individual and statistical fault points.

COMPARITIVE EXAMPLE 2

A test body comprised of PMMA having a thickness of 300 microns, on copper, was irradiated under the same conditions as in Example 2, until a dose of irradiation typical for 300 microns of structuring in PMMA had been received; the irradiation time was 6 hr. Developing with GG-developer followed. The teeth showed indistinct etching, and rounding of the structures over the entire height of the teeth. The resulting structure had individual and statistical fault points.

As seen from the comparison of Example 2 and Comparitive Example 2, the prescribed grid structure for a microspectrometer with typical grid teeth can be realized using PMMA only if the microstructure is less than 150 micron thick. In contrast, "SD 2054" allows a thicker irradiated layer. Despite the thicker layer, the irradiation time required is substantially less and the toothed structure of the grid is free of defects.

Obviously, numerous modifications and variations of the present invention are possible in light of the above teachings. It is therefore to be understood that within the scope of the appended claims, the invention may be practiced otherwise than as specifically described herein.

The priority document of the present application, German Patent Application No. 197 41 492.3, filed Sep. 19, 1997, is hereby incorporated by reference.

What is claimed is:

1. A method for manufacturing a microstructured body, comprising:
   applying a layer of a material to a support;
   patternwise irradiating said material with X-rays; and
   dissolving selectively irradiated or non-irradiated regions of said material;
   wherein said material comprises a light-hardening and/or UV-hardening epoxy coating, wherein said light-hardening and/or UV-hardening epoxy coating comprises a glycidyl ether group.

2. The method of claim 1, wherein said X-rays are synchrotron radiation.

3. The method of claim 1, further comprising, prior to said irradiating, applying said material to said support by spin-coating or pour-molding.

4. The method of claim 1, wherein said microstructured body comprises microstructures at a depth of 1–10,000 micron.

5. The method of claim 4, wherein said microstructured body comprises microstructures with an aspect ratio of 5:1 to 1000:1.

6. The method of claim 4, wherein said microstructured body comprises microstructures with an aspect ratio of 10:1 to 100:1.

7. The method of claim 1, wherein said microstructured body comprises microstructures at a depth of 10–1000 micron.

8. The method of claim 1, wherein said microstructured body comprises microstructures at a depth of 100–800 micron.

9. The method of claim 1, wherein said microstructured body comprises microstructures with an aspect ratio of 5:1 to 1000:1.

10. The method of claim 1, wherein said microstructured body comprises microstructures with an aspect ratio of 10:1 to 100:1.

11. The method of claim 1, wherein said dissolving is carried out with a selective developer comprising at least one member selected from the group consisting of organic solvents, glycol-containing alkali hydroxide solutions, and alcoholic alkali hydroxide solutions.

12. The method of claim 1, wherein said dissolving is carried out with a selective developer comprising an alkylene glycol alkylether alkylmonocarboxylic acid ester compound.

13. The method of claim 12, wherein said dissolving is carried out with a selective developer comprising at least one alkylene glycol alkylether alkylmonocarboxylic acid ester compound selected from the group consisting of propylene glycol monomethylether acetate (PGMEA), ethylene glycol butylether acetate and butylene glycol isopropylether propanoate.

14. The method of claim 1, flrther comprising, prior to said irradiating:
   applying an adhesive promoter to said support; and
   applying said material to said support.

* * * * *

UNITED STATES PATENT AND TRADEMARK OFFICE
CERTIFICATE OF CORRECTION

PATENT NO. : 6,251,567 B1
DATED : June 26, 2001
INVENTOR(S) : Holger Reinecke et al.

It is certified that error appears in the above-identified patent and that said Letters Patent is hereby corrected as shown below:

Column 2,
Line 23, "(wavelengths 300 mn to 460 mn)" should read -- (300 nm to 460 nm) --;
Line 32, "crosslinidng" should read -- crosslinking --.

Column 4,
Line 23, "sulfiric" should read -- sulfuric --.

Column 6,
Line 50, "flrther" should read -- further --.

Signed and Sealed this

Twenty-second Day of October, 2002

Attest:

Attesting Officer

JAMES E. ROGAN
Director of the United States Patent and Trademark Office

UNITED STATES PATENT AND TRADEMARK OFFICE
CERTIFICATE OF CORRECTION

PATENT NO.    : 6,251,567 B1                                                  Page 1 of 1
DATED         : June 26, 2001
INVENTOR(S)   : Holger Reinecke et al.

It is certified that error appears in the above-identified patent and that said Letters Patent is hereby corrected as shown below:

<u>Column 2,</u>
Line 23, "(wavelengths 300 mn to 460 mn)" should read -- (300 nm to 460 nm) --;
Line 32, "crosslinidng" should read -- crosslinking --.

<u>Column 4,</u>
Line 23, "sulfiric" should read -- sulfuric --.

<u>Column 6,</u>
Line 50, "flrther" should read -- further --.

Signed and Sealed this

Twenty-ninth Day of October, 2002

Attest:

Attesting Officer

JAMES E. ROGAN
*Director of the United States Patent and Trademark Office*